United States Patent [19]

Natarajan et al.

[11] Patent Number: 5,519,580

[45] Date of Patent: May 21, 1996

[54] METHOD OF CONTROLLING SOLDER BALL SIZE OF BGA IC COMPONENTS

[75] Inventors: Siva Natarajan, Gilbert; Debendra Mallik, Chandler, both of Ariz.

[73] Assignee: Intel Corporation, Santa Clara, Calif.

[21] Appl. No.: 303,440

[22] Filed: Sep. 9, 1994

[51] Int. Cl.$^6$ .................................................. H05K 7/02
[52] U.S. Cl. ........................ 361/760; 361/767; 361/808; 174/138 G
[58] Field of Search ................................. 361/743, 767, 361/760, 808, 803, 809; 174/138 G, 151, 52.4; 257/666, 734

[56] References Cited

U.S. PATENT DOCUMENTS

D. 200,157   1/1965   Vincent .
5,294,754   3/1994   Wu .......................................... 174/255

OTHER PUBLICATIONS

Amaro et al, Module–to–Circuit Card Standoff, Jul. 1975, IBM Disclosure Bulletin, vol. 18, No. 2 p. 408.
Orlando, Formed or Etched Metal Spacer Disks for Flexible Disk Pads, Feb. 1976, IBM T.D.B. vol. 18, No. 9, p. 2964.

*Primary Examiner*—Leo P. Picard
*Assistant Examiner*—Y. Whang
*Attorney, Agent, or Firm*—Blakely, Sokoloff, Taylor & Zafman

[57] ABSTRACT

A ball grid array (BGA) package which has a plurality of solder balls attached to solder landings that each have a number of tabs which extend from a center area of the landing. The tabs assist in a symmetric formation of solder balls that are formed on the landings. When constructing the package, a solder mask is applied to a bottom package surface before the application of the solder balls. The solder mask has a plurality of openings which expose the solder landings and are larger than the center area of the landings. Solder balls are then placed onto the solder landings and reflowed so that the balls become attached to the landings. The fully exposed center areas of the solder landings allow the solder to flow vertically along the outer walls of the landings, thereby providing a more robust solder joint. The exposed solder landings also allow a solder flux to be thoroughly cleaned after the solder balls are attached to the landings. Additionally, the land tabs insure an even solder flow about the solder landings to produce a symmetric uniform solder balls.

13 Claims, 3 Drawing Sheets

FIG. 3
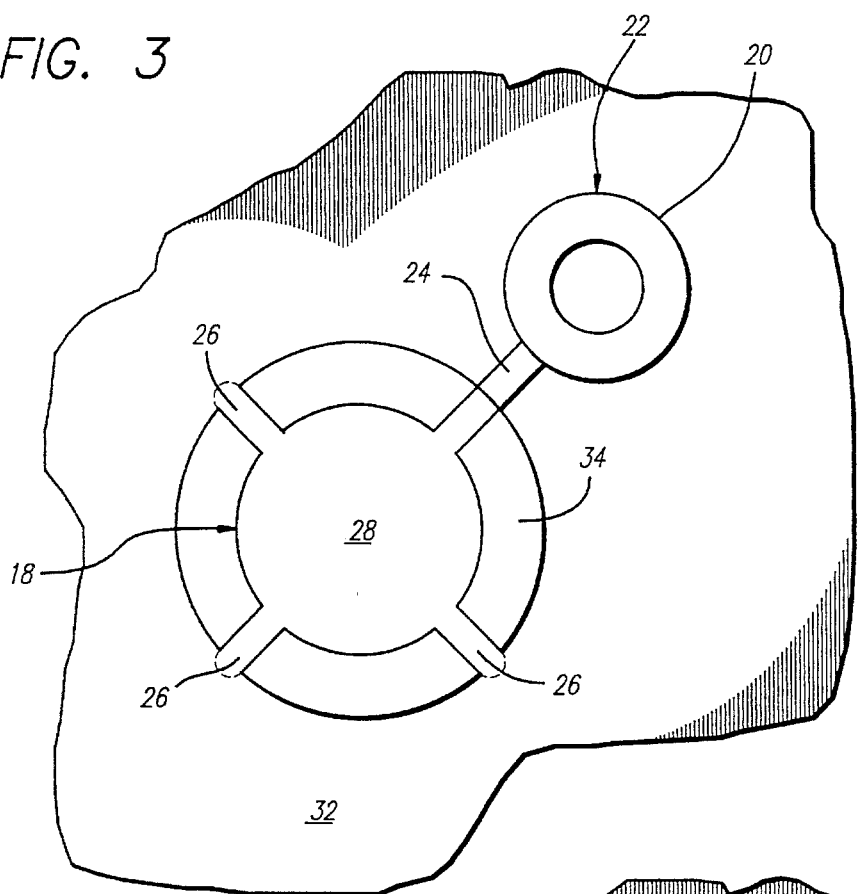
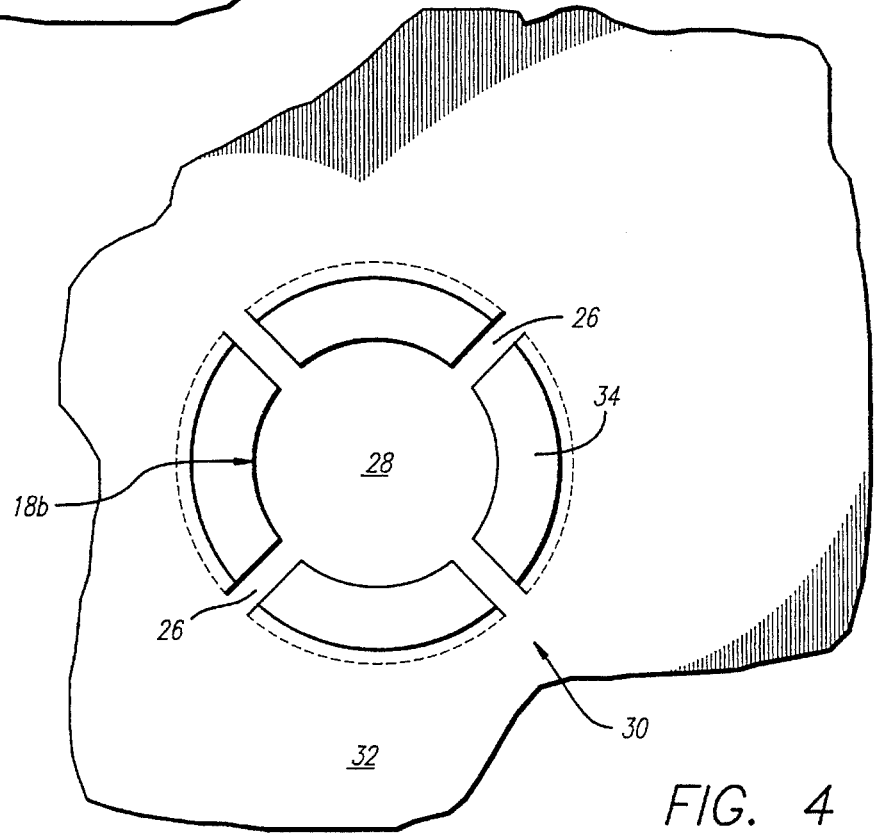
FIG. 4

METHOD OF CONTROLLING SOLDER BALL SIZE OF BGA IC COMPONENTS

BACKGROUND OF THE INVENTION

1. Field of the Invention

The present invention relates to a ball grid array integrated circuit package.

2. Description of Related Art

Integrated circuits are typically housed within a package that is soldered to a printed circuit board. One type of integrated circuit package is a ball grid array (BGA) package. BGA packages typically have a plurality of electrically conductive solder landings arranged in a two dimensional array along the bottom surface of the package. The solder landings are coupled to the integrated circuit by vias that extend through the body of the package.

Attached to each solder landing is a ball of solder that is subsequently reflowed when the package is mounted to the printed circuit board. The solder balls are typically attached to the package by placing hard solder balls on the solder landings and then reflowing the solder. The solder balls reharden as a sphere that is attached to the landings. To prevent the solder from flowing to an adjacent soldering landing and shorting the package, a solder mask is typically applied to the bottom package surface. The solder mask has a plurality of openings that are concentric with the solder landings and allow the solder balls to be attached to the package. To fully insure that the solder remains in the area of the solder landing, the openings in the solder mask typically have a diameter that is smaller than the diameter of the landings.

To improve the solder interface between the solder balls and the solder landings a solder flux is typically applied to the conductive package surfaces and cleaned after the balls are placed onto the landings. It is difficult to remove all of the solder flux from the solder mask openings. Consequently some flux remains within the openings when the solder balls are placed onto the package. It has been found that the remaining flux within the solder openings can degrade the solder joint of the solder balls.

Additionally, the tolerances of the solder mask openings are relatively large, resulting in openings of different sizes. The different size openings create solder balls with different heights. Any lack of coplanarity between the solder balls and the printed circuit board may produce a final assembly with less than robust solder joints. It would therefore be desirable to have a package and method for producing a BGA package which has a plurality of uniform and robust solder joints.

SUMMARY OF THE INVENTION

The present invention is a ball grid array (BGA) package which has a plurality of solder balls attached to solder landings that each have a number of tabs which extend from a center area of the landing. The tabs assist in a symmetric formation of solder balls that are formed on the landings. When constructing the package, a solder mask is applied to a bottom package surface before the application of the solder balls. The solder mask has a plurality of openings which expose the solder landings and are larger than the center area of the landings. A portion of the tabs that extend from the center area of the landing are covered by solder mask. Solder balls are then placed onto the solder landings and reflowed so that the balls become attached to the landings. The fully exposed center areas of the solder landings allow the solder to flow vertically along the outer walls of the landings, thereby providing a more robust solder joint. The exposed solder landings also allow solder flux to be thoroughly cleaned after the solder balls are attached to the landings. Additionally, the land tabs insure an even solder flow about the solder landings to produce a symmetric uniform solder ball.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 3 is an enlarged view of a solder landing of the package coupled to a via;

FIG. 4 is an enlarged view of a solder landing of the package coupled to a ground or power plane;

DETAILED DESCRIPTION OF THE INVENTION

Figure 1:
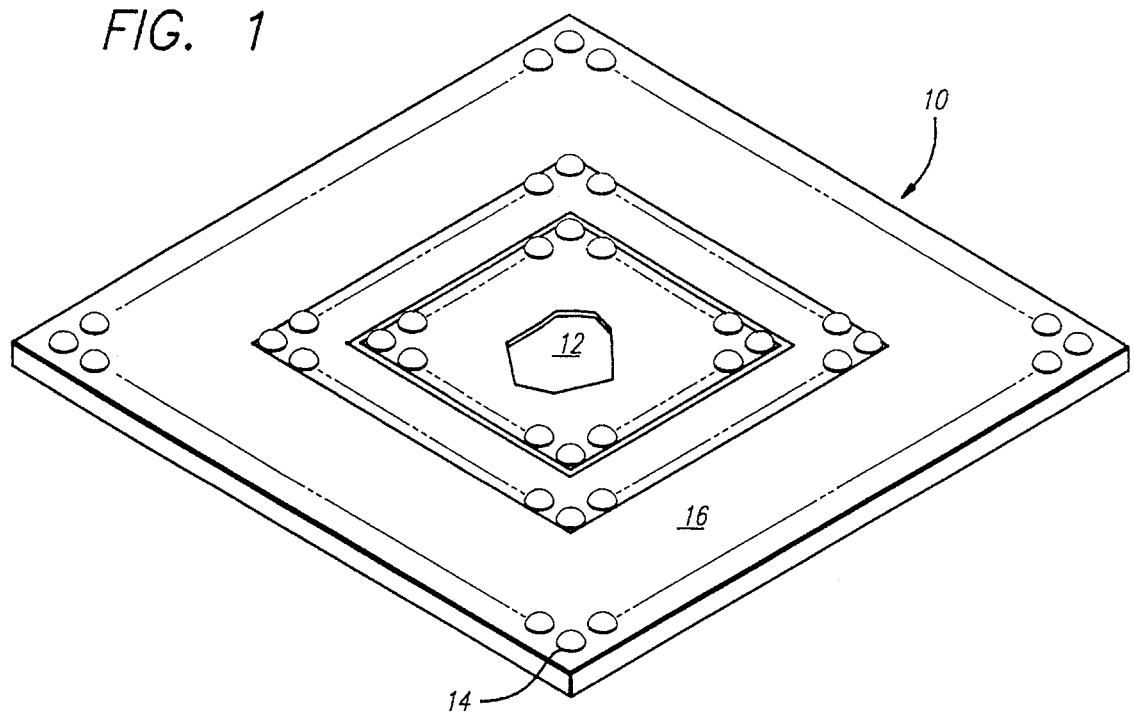
FIG. 1 is a perspective view of a ball grid array package of the present invention.

Referring to the drawings more particularly by reference numbers, FIG. 1 shows an integrated circuit package 10 of the present invention. The type of package shown is commonly referred to as a Ball Grid Array (BGA). The package 10 houses an integrated circuit 12 such as a microprocessor. The package 10 has a plurality of solder balls 14 that extend from a bottom package surface 16. The solder balls 14 are typically soldered to a printed circuit board to electrically and mechanically couple the package 10 to the board.

Figure 2:
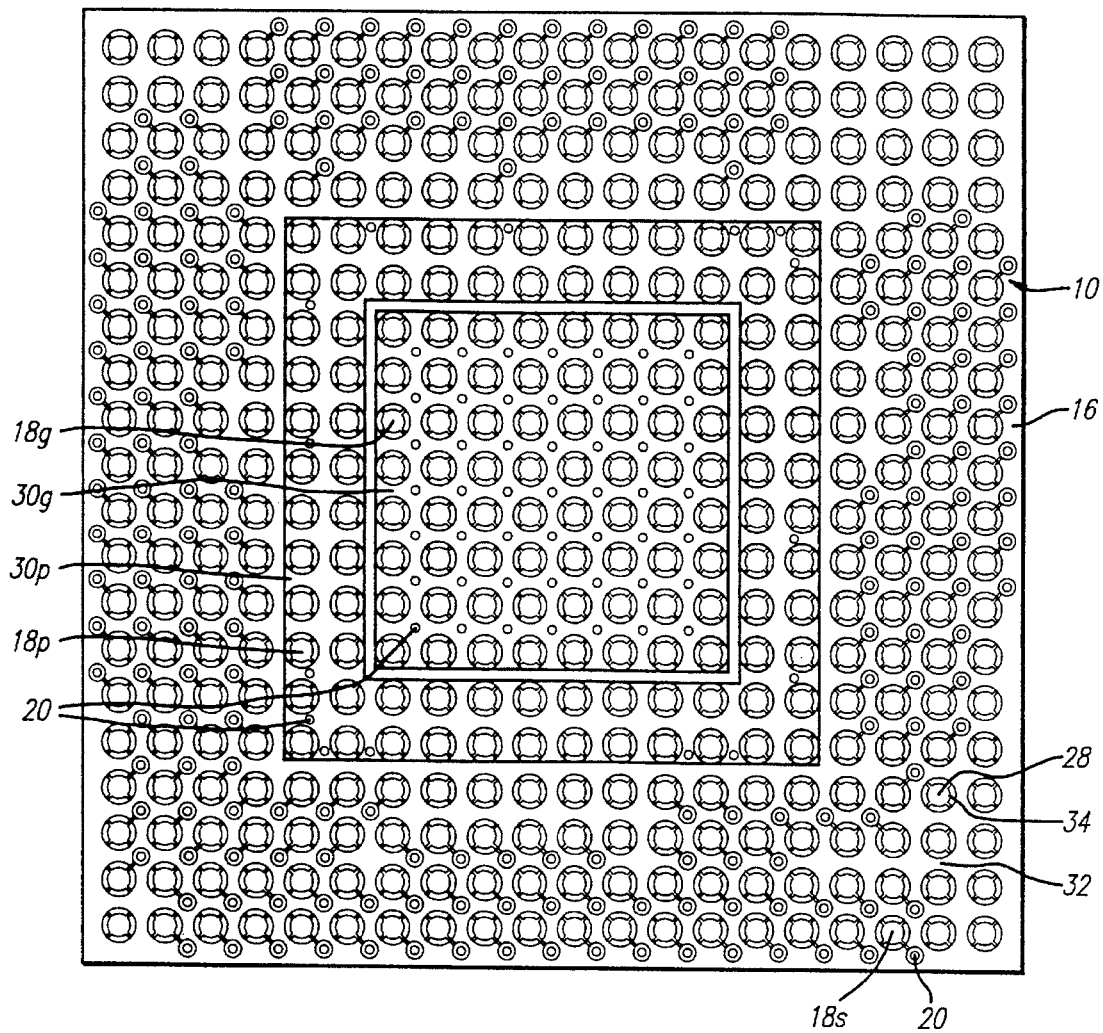
FIG. 2 is a bottom view of the package of FIG. 1.

FIG. 2 shows the bottom of the package 10 before the solder balls 14 are attached thereto. Extending along the bottom surface 16 of the package 10 are a plurality of solder landings 8s, p and g. The solder landings 18 are typically etched from a copper material using conventional photolithographic techniques. The copper can be plated with gold or other materials as is known in the art.

Integrated circuits typically have pins dedicated to power, ground and digital signals. Consequentially, the package 10 has a plurality of solder landings dedicated to power 18p, ground 18g and signals 18s. The solder landings 18 are coupled to the integrated circuit 12 by internal wire routing (not shown and vias 20 that extend into the body of the package 10.

As shown in FIG. 3, each signal solder landings 18s is coupled to a conductive via landing 22 by a conductive connecting bar 24. Each connecting bar 22 provides an electrical connection between the solder landing 18s and the via 20 of the via landing 22. The solder landing 18s also has a plurality of conductive tabs 26 that symmetrically extend from a center area 28 of the landing 18s.

As shown in FIG. 4, the power and ground solder landings 18 have a plurality of tabs 26 that symmetrically extend from a center area 28. Each tab of the power/ground solder landings 18 is attached to a conductive plane 30 that extends across a predetermined area of the bottom package surface 16. Multiple symmetric tabs improve electrical performance due to uniform current distribution. As shown in FIG. 2, the power solder landings 18p are connected to a power plane 30p. The ground solder landings 18g are attached to a ground plane 30g.

The bottom surface 16 of the package 10 is covered with a solder mask 32. The solder mask 32 has a plurality of openings 34 that expose the solder landings 18. The openings 34 have a diameter that is larger than the diameter of the center areas 28 of the landings 18. The solder mask 32 can be applied with conventional screening techniques known in the art. In the preferred embodiment, the solder landings have a center area diameter of approximately 0.023 inches and the openings have a diameter between 0.025–0.027 inches. The distance between the solder landings 18 may be between 0.050–0.060 inches. The solder mask 32 typically has a thickness of approximately 0.001 inches.

Figure 5:
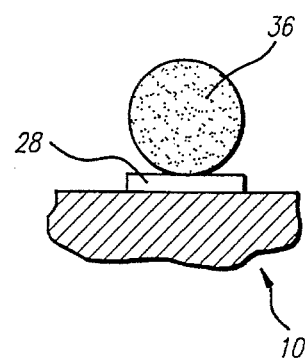
FIG. 5 is a side view showing a solder ball being placed onto a solder landing.

As shown in FIG. 5, to assemble the package 10, a plurality of solder balls 36 are placed into the solder mask openings 34 and onto the solder landings 18. A solder flux is typically applied to the solder landings prior to the placement of the solder balls into the openings 34. The large openings allows the flux to be thoroughly cleaned from the landings.

Figure 6:
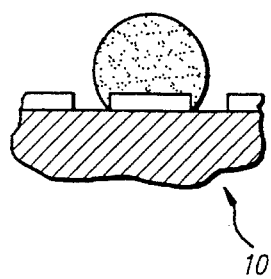
FIG. 6 is a side view showing the solder ball reflowed onto the solder land.

As shown in FIG. 6, the solder balls 36 are reflowed and allowed to reharden. The fully exposed solder landings 18 allow some of the solder to flow down the vertical edge of the center areas 28 to the bottom surface of the package. The vertical flow of solder produces a more robust solder joint. The symmetric tabs 26 allow equal symmetric solder flow across the center area so that there is created a symmetric uniform solder joint. The diameter and thus the height of the solder joint can be accurately controlled because of the relatively small tolerances that are obtained by forming the center areas with photolithographic processing. The solder balls typically have an initial diameter of 0.030 inches and a height of approximately 0.025 after attachment to the package.

Figure 7:
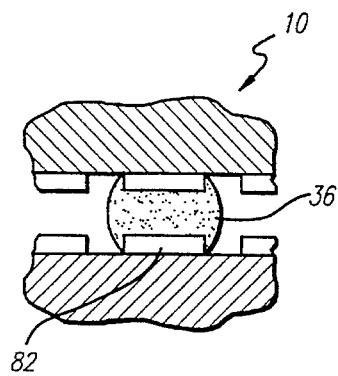
FIG. 7 is a side view showing the package soldered to a printed circuit board.

As shown in FIG. 7, the package 10 is typically mounted to a printed circuit board 40 which has a plurality of conductive surface pads 42 arranged in the same pattern as the solder landings 18. The solder balls 36 are reflowed to solder the package 10 to the circuit board 38. The present invention provides a plurality of uniform robust surface mounted solder joints between the package 10 and the board 40.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a package which has a bottom surface;

an integrated circuit within said package; and, a solder landing on said bottom surface, said solder landing having a plurality of tabs that symmetrically extend from a center area of said solder landing.

2. The electronic package as recited in claim 1, further comprising a solder mask attached to said bottom surface of said package, said solder mask has an opening that is concentric with said solder landing and has a diameter larger than an outer diameter of said center area of said solder landing.

3. The electronic package as recited in claim 1, wherein said solder landing is coupled to a via landing by one of said tabs.

4. The electronic package as recited in claim 1, wherein said solder landing is coupled to a conductive plane by said tabs.

5. The electronic package as recited in claim 1, wherein there are a plurality of solder landings arranged in a two dimensional array.

6. The electronic package as recited in claim 1, further comprising a solder ball attached to said solder landing.

7. An electronic assembly, comprising:

a printed circuit board with a surface pad;

a package with a bottom surface;

an integrated circuit within said package;

a solder landing on said bottom surface, said solder landing having a plurality of tabs that symmetrically extend from a center area of said solder landing; and, a solder ball that couples said solder landing to said surface pad.

8. The electronic assembly as recited in claim 7, wherein said solder landing is coupled to a via landing on said bottom surface by one of said tabs.

9. The electronic assembly as recited in claim 7, wherein said solder landing is coupled to a conductive plane by said tabs.

10. The electronic assembly as recited in claim 7, wherein there are a plurality of solder landings, surface pads and solder balls arranged in a two dimensional array.

11. A method for assembling a ball grid array electronic package, comprising:

a) providing a package which has a solder landing located on a bottom surface of said package, said solder landing having a plurality of tabs that symmetrically extend from a center area of said solder landings;

b) covering said bottom surface of said package with a solder mask so that said solder mask has an opening that is concentric with said solder landing; and, c) applying a solder ball to said solder landing.

12. The method as recited in claim 11, wherein said opening of said solder mask opening has a diameter that is larger than a diameter of said center area of said solder landing.

13. The method as recited in claim 11, further comprising the step of soldering said solder ball to a printed circuit board.

\* \* \* \* \*

UNITED STATES PATENT AND TRADEMARK OFFICE
CERTIFICATE OF CORRECTION

PATENT NO. : 5,519,580
DATED : May 21, 1996
INVENTOR(S) : Natarajan et al.

It is certified that error appears in the above-indentified patent and that said Letters Patent is hereby corrected as shown below:

In column 2 at line 46 delete "landings 8s," and insert --landings 18s,--

Signed and Sealed this

Fifteenth Day of April, 1997

Attest:

BRUCE LEHMAN

Attesting Officer         Commissioner of Patents and Trademarks